United States Patent
Schroedinger (10) Patent No.: US 6,853,230 B2
(45) Date of Patent: Feb. 8, 2005

(54) METHOD AND APPARATUS FOR PRODUCING A CLOCK OUTPUT SIGNAL

(75) Inventor: Karl Schroedinger, Berlin (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/992,281

(22) Filed: Nov. 16, 2001

(65) Prior Publication Data

US 2003/0001647 A1 Jan. 2, 2003

(30) Foreign Application Priority Data

Jun. 29, 2001 (DE) .......................................... 101 32 230

(51) Int. Cl.[7] .............................................. H03H 11/16
(52) U.S. Cl. ...................................... 327/231; 327/247
(58) Field of Search ................................ 327/247, 231, 327/233, 238, 239, 254, 157, 148; 331/135; 375/374

(56) References Cited

U.S. PATENT DOCUMENTS

| | | | | |
|---|---|---|---|---|
| 4,817,150 A | * | 3/1989 | Filliman ........................ | 381/7 |
| 5,015,872 A | | 5/1991 | Rein ........................... | 327/231 |
| 5,614,855 A | * | 3/1997 | Lee et al. .................... | 327/158 |
| 5,970,110 A | | 10/1999 | Li ............................. | 377/48 |
| 6,194,929 B1 | * | 2/2001 | Drost et al. ................. | 327/156 |
| 6,400,200 B2 | * | 6/2002 | Sasaki ........................ | 327/244 |
| 2002/0067195 A1 | * | 6/2002 | Fischer ....................... | 327/237 |

FOREIGN PATENT DOCUMENTS

| | | |
|---|---|---|
| DE | 39 14 249 A1 | 12/1990 |
| DE | 39 40 860 A1 | 6/1991 |
| DE | 195 34 516 A1 | 3/1996 |
| DE | 197 01 937 A1 | 7/1997 |
| DE | 197 03 986 A1 | 12/1997 |
| DE | 198 34 416 C2 | 2/1999 |
| DE | 199 34 501 C1 | 11/2000 |
| EP | 0 304 791 B1 | 3/1989 |
| EP | 0 512 621 B1 | 11/1992 |
| EP | 0 881 774 A2 | 12/1998 |

OTHER PUBLICATIONS

Thomas H. Lee et al.: "A 2.5 V CMOS Delay–Locked Loop for an 18 Mbit, 500 Megabyte/s DRAM", IEEE Journal of Solid–State Circuits, vol. 29, No. 12, Dec. 1994, pp. 1491–1496.

* cited by examiner

Primary Examiner—Linh My Nguyen
(74) Attorney, Agent, or Firm—Laurence A. Greenberg; Werner H. Stemer; Gregory L. Mayback (57) ABSTRACT

An apparatus for producing a clock output signal, having an input for receiving an input signal containing a phase information item; a clock generator for producing a multiplicity of clock signals whose phases are respectively shifted from one another by a predetermined amount; and a weighting and mixing circuit for weighting each of the multiplicity of clock signals based on the phase information item contained in the input signal. The weighting and mixing circuit is also for mixing the weighted clock signals in order to produce a clock output signal whose phase essentially matches the phase represented by the phase information item.

4 Claims, 9 Drawing Sheets

| | 45°–135° | 135°–225° | 225°–315° | 315°–405° |
|---|---|---|---|---|
| S0 | 0 | 0 | 0 | 1 |
| S1 | 0 | 1 | 0 | 0 |
| S2 | 1 | 0 | 0 | 0 |
| S3 | 0 | 0 | 1 | 0 |
| U0 (POSITIVE OUTPUT FROM SDiff1) | POSITIVE | low | NEGATIVE | high |
| U1 (POSITIVE OUTPUT FROM SDiff2) | high | NEGATIVE | low | POSITIVE |
| U2 (NEGATIVE OUTPUT FROM SDiff1) | NEGATIVE | high | POSITIVE | low |
| U3 (NEGATIVE OUTPUT FROM SDiff2) | low | POSITIVE | high | NEGATIVE |
| G1 (GAIN OF SDiff1) | +1 | 0 | −1 | 0 |
| G2 (GAIN OF SDiff2) | 0 | −1 | 0 | +1 |

METHOD AND APPARATUS FOR PRODUCING A CLOCK OUTPUT SIGNAL

BACKGROUND OF THE INVENTION

Field of the Invention

The present invention relates to a method and apparatus for producing a clock output signal, and in particular, but not exclusively, to a delay circuit for a clock having an infinitely adjustable delay for use in delay locked loop (DLL) circuits. The invention also relates to a charge pump and to a control loop of a delay locked loop.

DLL circuits are known, among other things, from U.S. Pat. No. 5,015,872 and also from the publication by Thomas H. Lee et al. in IEEE Journal of Solid State Circuits, Vol. 29, No. 12, December 1994. The drawback in these circuits is that the clock input frequency is halved before phase shifting, in order to be doubled subsequently, i.e. after phase shifting. This can be problematic at high clock frequencies, or may require very fast and precise EXOR gates and mixers. Nonlinearities may also arise in this context.

Figure 1:
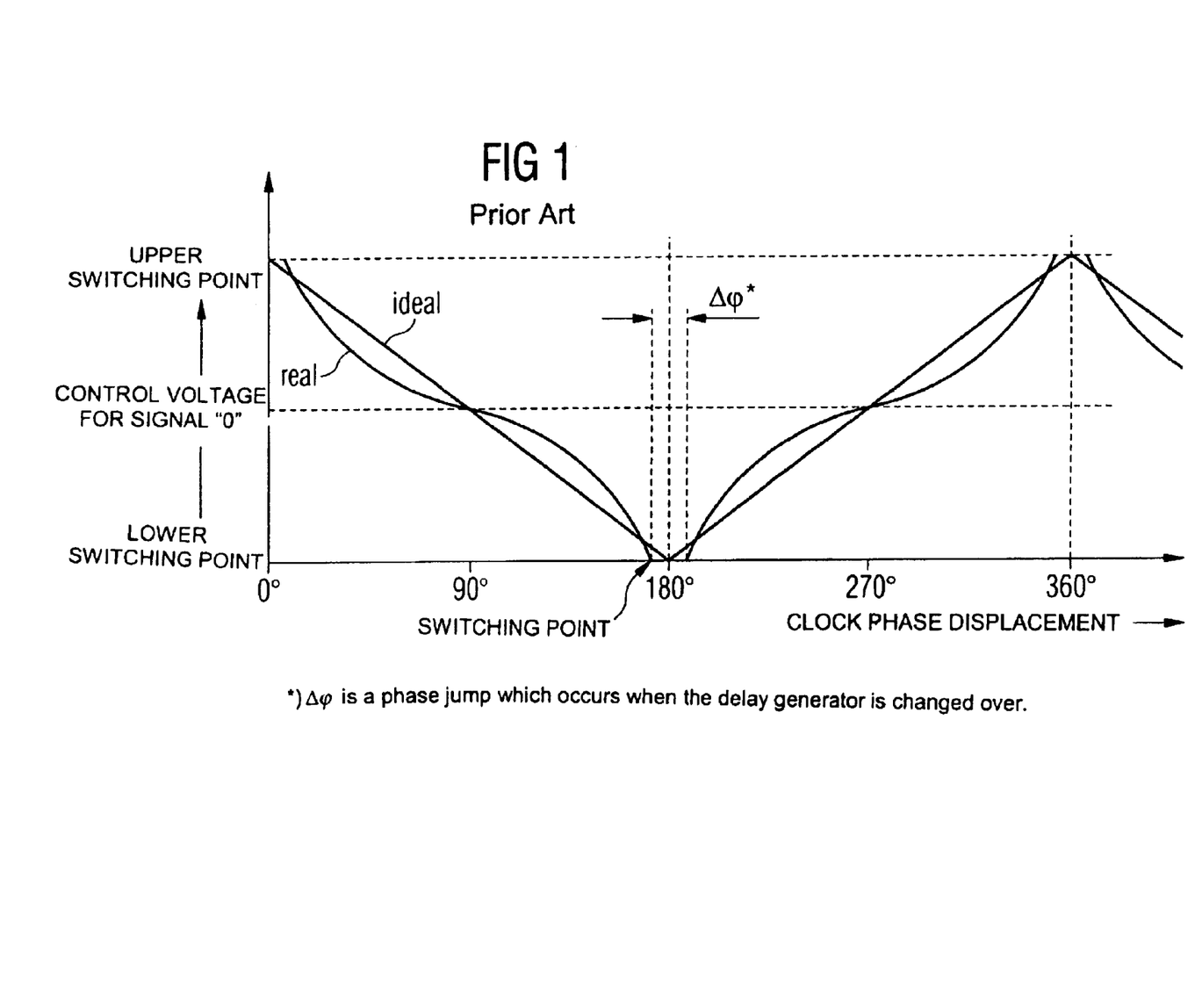
FIG. 1 shows a voltage characteristic when the polarity of a charge pump changes over in a known DLL circuit.

In addition, when window comparators are produced which monitor the control voltage and control the actual delay generator, as in the aforementioned publication by Lee et al. ("quadrant boundary detector"), problems arise in the changeover, as shown in FIG. 1. FIG. 1 shows a comparison between an ideal curve and a real curve. Apart from the nonlinearity of the twisting (real) curve, which changes the loop gain of the DLL loop, a phase jump generally occurs at the changeover point (e.g. at 180°), because the changeover point cannot be set with absolute certainty (tolerances). This means that particular phase adjustments cannot be made and oscillation may occur (abrupt switching between the phases $180°-\Delta\phi°$ and $180°+\Delta\phi°$ when the desired phase is situated in between).

SUMMARY OF THE INVENTION

It is accordingly an object of the invention to provide an apparatus for producing a clock signal, a control loop, a charge pump, and a method for producing a clock signal which overcome the above-mentioned disadvantages of the prior art apparatus and methods of this general type.

With the foregoing and other objects in view there is provided, in accordance with the invention, a method for producing a clock output signal, that includes steps of: receiving an input signal that contains an information item representing a phase; producing a plurality of clock signals having phases that are respectively shifted from one another by a predetermined amount; weighting each one of the plurality of the clock signals in dependence on the information item that is contained in the input signal; and mixing the weighted clock signals in order to produce a clock output signal having a phase that essentially matches the phase that is represented by the phase information item.

With this method, it is thus possible to dispense with halving the clock frequency. Instead, the original clock frequency is retained and suitable phase shifts are used to produce a clock output signal, which has the desired phase.

In particular, the method preferably involves producing a clock input signal of a predetermined frequency, which signal is duplicated by repeated phase shifting, so that the aforementioned multiplicity of clock signals are obtained which all have the predetermined frequency. This "clock signal multiplication" with the retention of a clock input signal frequency can be used to produce a desired phase, as mentioned, by means of subsequent weighting and mixing, without the need to perform any disadvantageous frequency halving on the clock signal.

In accordance with an additional mode of the invention, the multiplicity of clock signals are four clock signals whose phases are shifted from one another by 90° and which are preferably produced from the clock input signal by using a quadrature oscillator.

In accordance with an additional mode of the invention, the weighted clock signals are mixed by addition. Furthermore, it is possible to carry out band-limiting in order to filter out harmonics when mixing the weighted clock signals.

With the foregoing and other objects in view there is provided, in accordance with the invention, an apparatus for producing a clock output signal, that includes: an input for receiving an input signal containing a phase information item representing a phase; a clock generator for producing a plurality of clock signals having phases that are shifted from one another by a predetermined amount; and a weighting and mixing circuit for weighting each one of the plurality of the clock signals based on the phase information item to obtain a plurality of weighted clock signals. The weighting and mixing circuit is also for mixing the plurality of the weighted clock signals to produce a clock output signal having a phase that essentially matches the phase represented by the phase information item.

This apparatus may, by way of example, be part of a delay lock loop control loop. The clock generator can be formed by a quadrature oscillator for producing four clock signals whose phases are shifted from one another by 90°.

With the foregoing and other objects in view there is provided, in accordance with the invention, a control loop, that includes: a phase shifter for producing a first clock phase; a phase detector for detecting a phase difference between a second clock phase and the first clock phase, the phase detector producing an output signal based on the detected phase difference; a charge pump for integrating the output signal of the phase detector, the charge pump having both integration polarities; and a controller for changing over the integration polarity of the charge pump at predetermined switching points based on the detected phase difference. The switching points are subject to hysteresis. This apparatus eliminates the drawbacks mentioned in the introduction of adjustment points, which can be adjusted only imprecisely and also of undesirable phase jumping. In particular, the "phase hole" $\phi°$ shown in FIG. 1 is avoided.

In accordance with an added feature of the invention, such a phase shifter can be used in delay lock loop circuits.

With the foregoing and other objects in view there is provided, in accordance with the invention, a method for producing a clock signal, that includes: detecting a phase difference between a clock phase of a first input signal for a phase shifter and a clock phase of a first output signal of the phase shifter; producing a second output signal based on the detected phase difference; producing a second input signal for the phase shifter by integrating the second output signal; and changing over a polarity of the integrating at predetermined switching points based on the detected phase difference, the switching points being subject to hysteresis.

With the foregoing and other objects in view there is provided, in accordance with the invention, a charge pump for producing an output signal that includes a charge pump circuit for receiving an input signal having a phase. The charge pump circuit is also for producing an output signal having a phase. The output signal is either a proportional signal essentially proportional to the phase of the input signal or an inversely proportional signal essentially inversely proportional to the phase of the input signal. The charge pump circuit is designed such that the output signal changes between the proportional signal and the inversely proportional signal at predetermined switching points at which a predetermined jump in the phase of the output signal takes place.

In accordance with an additional feature of the invention, the switching points are preferably subject to hysteresis.

In accordance with a concomitant feature of the invention, the predetermined jump is advantageously a phase return of predetermined magnitude.

Other features which are considered as characteristic for the invention are set forth in the appended claims.

Although the invention is illustrated and described herein as embodied in method and apparatus for producing a clock output signal, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 2:
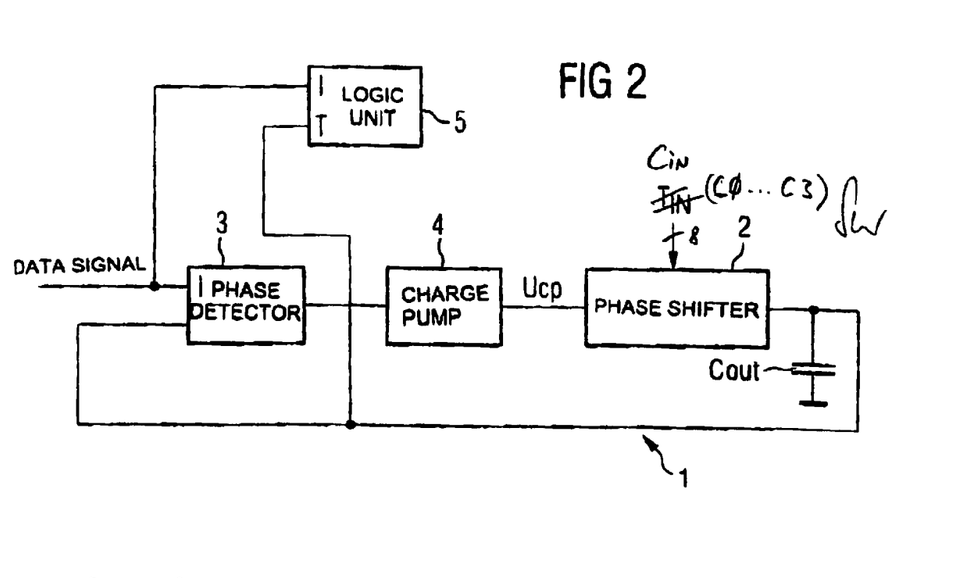
FIG. 2 schematically shows a block diagram of a DLL circuit having a phase shifter based an exemplary embodiment of the invention.

Referring now to the figures of the drawing in detail and first, particularly, to FIG. 2 thereof, there is shown an illustrative delay locked loop (DLL) circuit 1 containing a phase shifter 2 in accordance with a refinement of the invention. The DLL circuit 1 also has a phase detector 3 and a charge pump 4. The phase detector 3 has an input I for receiving a data signal. The data signal is additionally supplied to an input I of the logic unit 5, which is clocked by a clock output signal Cout of the DLL circuit 1 via a clock input T. The purpose of the DLL circuit 1 is to provide a clock signal Cout, which is in phase with the pulse timing of the data signal. DLL circuits as such are known and are therefore not explained in more detail here.

Figure 3:
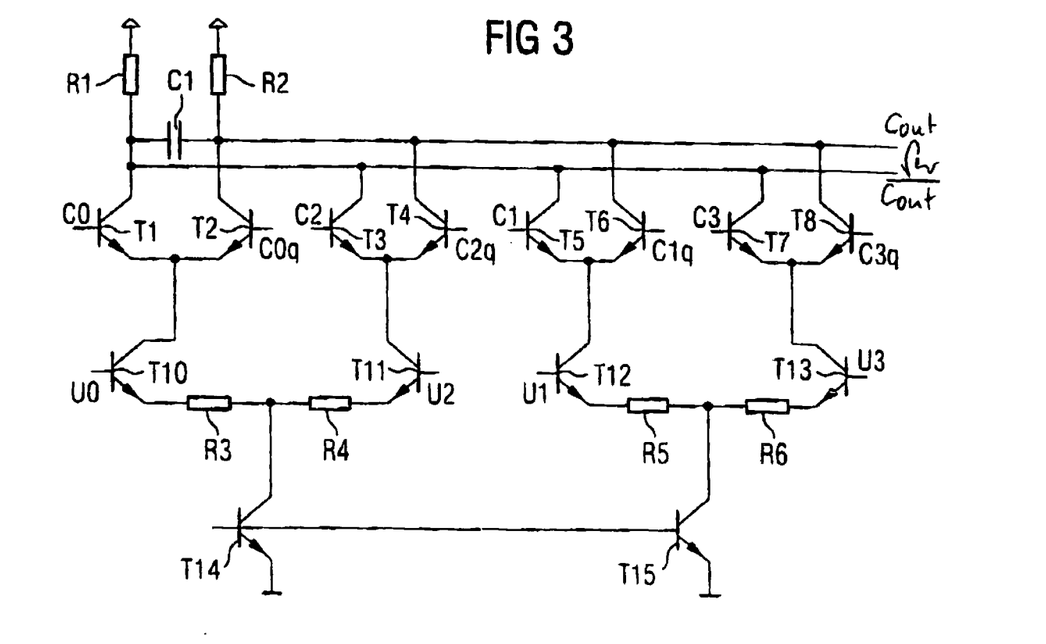
FIG. 3 shows a circuit, contained in the phase shifter from FIG. 2, for producing a clock output signal.
Figure 4:
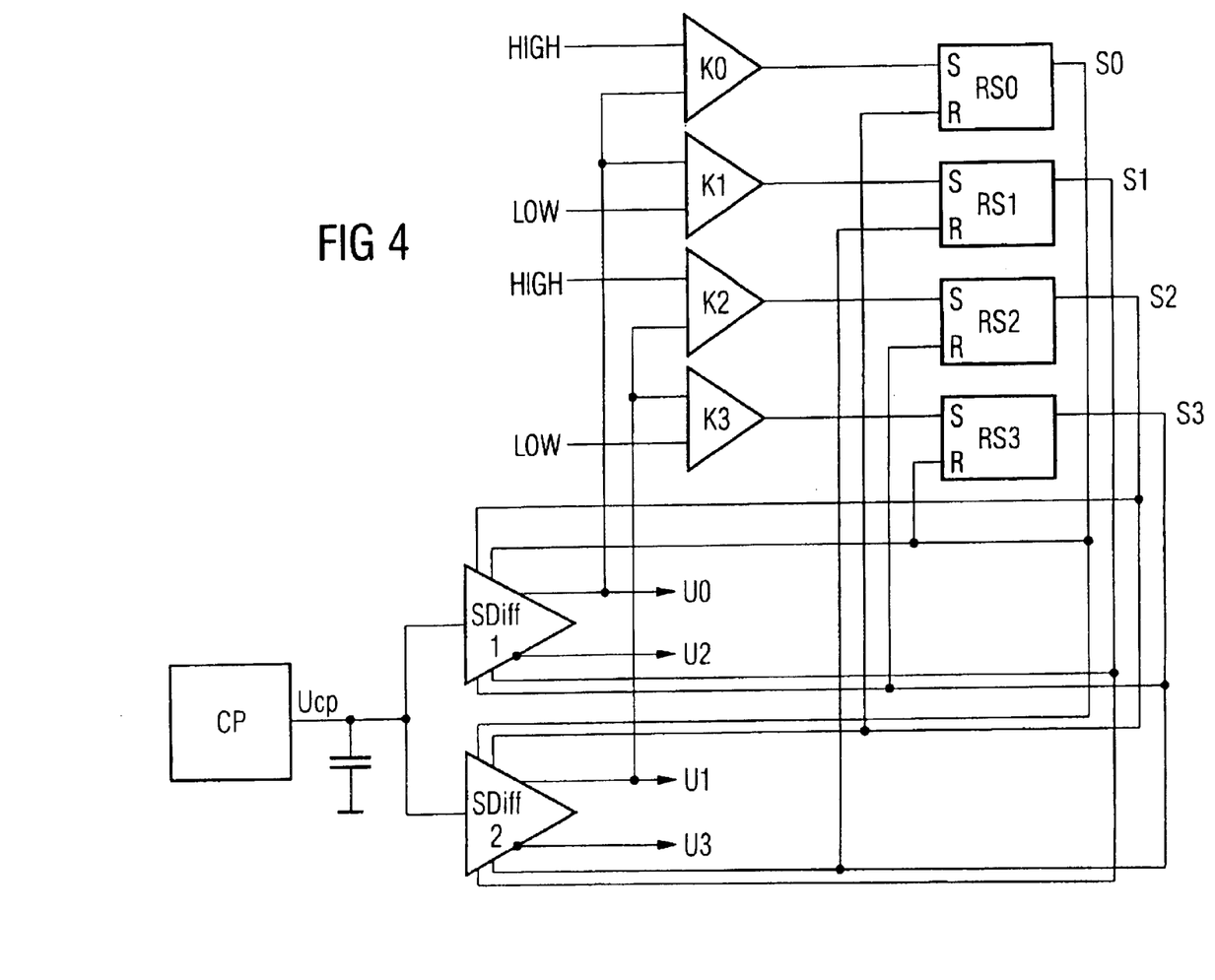
FIG. 4 shows a control circuit, which is likewise contained in the phase shifter from FIG. 2, for selecting and controlling input clocks for the circuit from FIG. 3.
Figure 5:
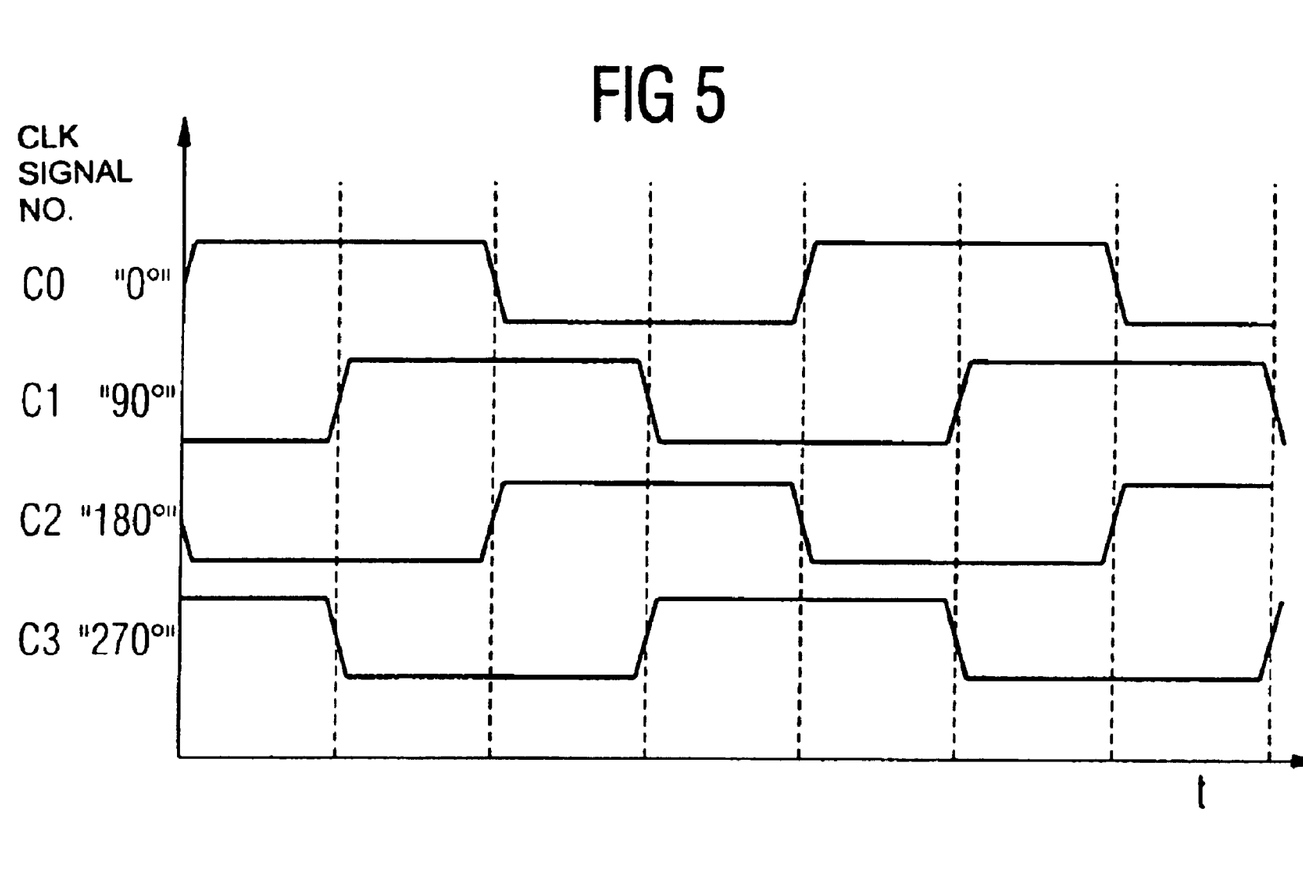
FIG. 5 shows the four clock input signals for the circuit from FIG. 3.

FIGS. 3 and 4 show the circuit contained in the phase shifter 2 from FIG. 2. FIG. 3 shows a circuit for producing the clock signal $C_{out}$ by mixing the clock signals C0 to C3. These four clock signals C0 to C3 are shown in FIG. 5. The circuit contains two mixers, which are respectively operated with the appropriate clock phases and operate differentially on the same load resistors R1 and R2. A capacitor C1 (optional) is used for band-limiting, since only the fundamentals of the individual phases of the clock signals C1 to C3 need to be mixed (added), and harmonics need to be filtered out accordingly. The control voltages U0 to U4 are used to weight the respective clock signals C0 to C3 in an appropriate manner.

The circuit shown does not use the halved clock frequency (as in the prior art), but rather uses the original clock frequency, which contains the appropriate phase shift as a result of suitable phase shifter circuits. This means that a total of four clock phases are admittedly necessary; since, however, in each case two of these clock signals are inverted with respect to one another, they are easily available anyway (Cxq is the inverted clock signal of Cx, C0=C2q, C0q=C2, C1=C3q, C3=C1q in FIGS. 3, 5 and 9). These phases can, by way of example, be produced using a quadrature oscillator which produces the clock signals denoted in FIG. 5 by 0° and 90° and also the respectively inverted clock signals 180° and 270°.

Figure 6:
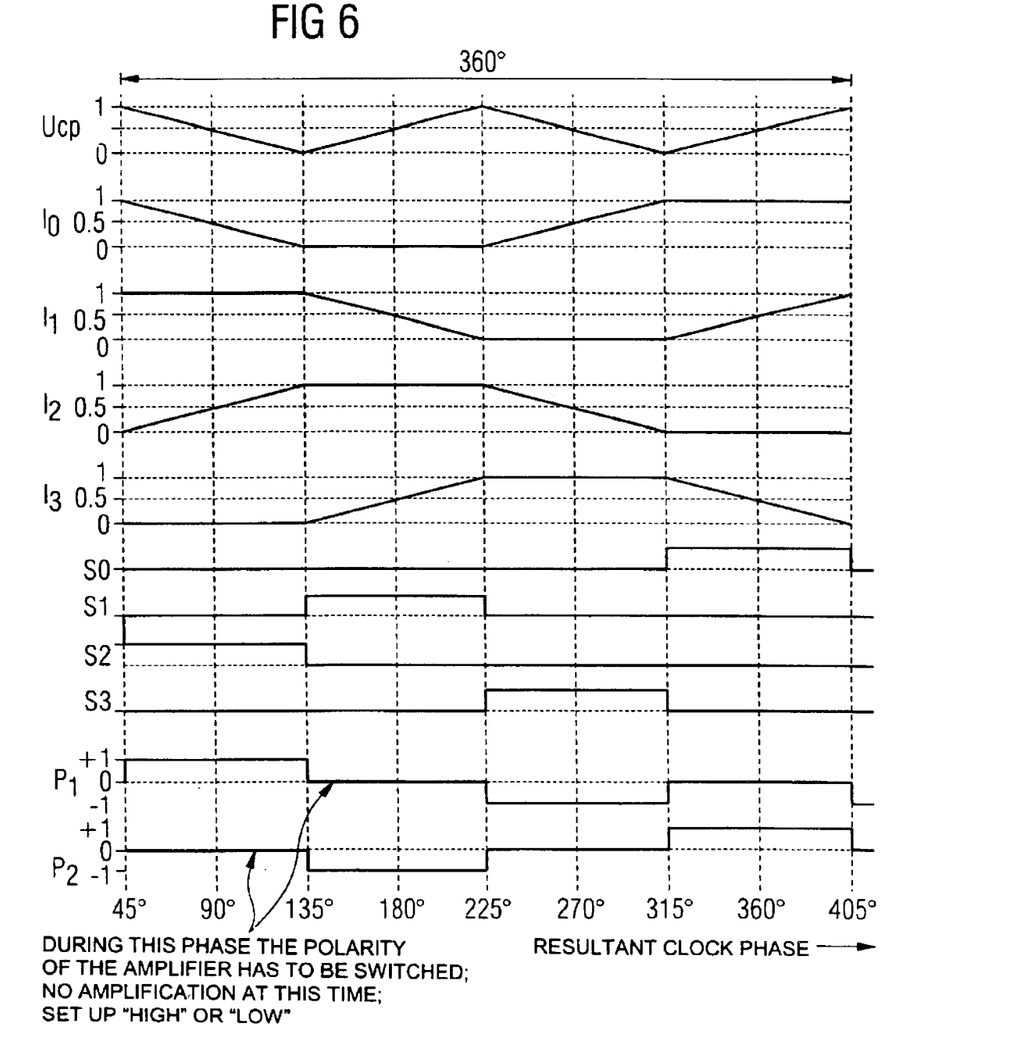
FIG. 6 shows the signals for the control circuit from FIG. 4 (where In is proportional to Un)

The clock signals are selected and controlled by the control circuit shown in FIG. 4 in order to produce the control voltages U0 to U3. FIG. 6 shows the control signals produced by the circuit shown in FIG. 4 for the purpose of mixing the clock signals (where the currents I0 to I3 are proportional to the voltages U0 to U3). The switching elements RS0 to RS3 in FIG. 4 are RS flip-flop circuits (reset-set), and K0 to K3 are comparators. The comparators K0 to K3 are adjusted such that they trigger a changeover operation as soon as the control voltages U0 to U3 reach the upper or lower limitation, i.e. no further phase shift can be achieved. The changeover operation is triggered by triggers from the flip-flop circuits. Changeover takes place such that the signals shown in FIG. 6 are generated.

As already indicated above, one advantage of this circuit is the use of the original clock frequency, and not of half the clock frequency, as in the aforementioned known circuits. This eliminates the problematical frequency doubling which is required in these circuits.

Figure 10:
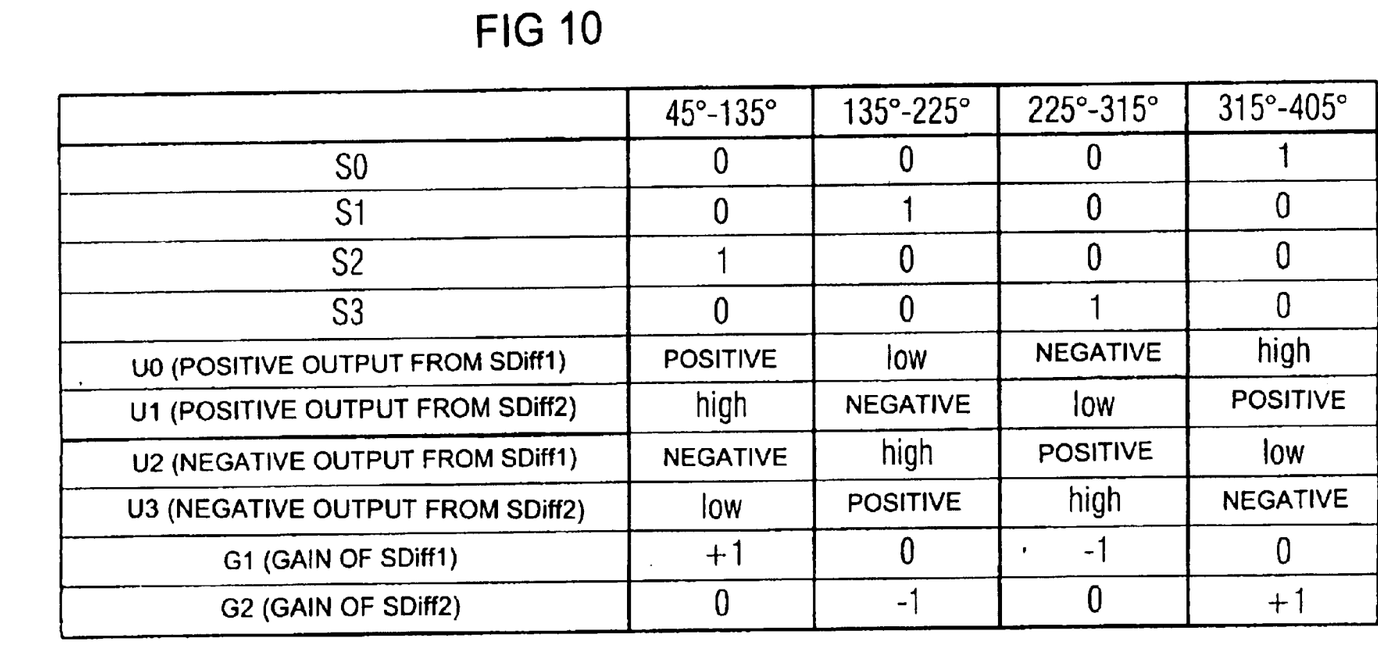
FIG. 10 is a table summarizing the properties of the control circuit shown in FIG. 4 (signals S0 to S3, U0 to U3) as a function of the required clock phase (45'... 405')

FIG. 6 likewise shows the control signals S0 to S3 for controlling the mixer and the amplifier SDiff (single-ended push-pull converter). Since only one of the mixers is controlled in each case, the respective inactive amplifier needs to be turned off or switched to a fixed potential, under the control of the signals S0 to S3. In addition, in accordance with the requirements, the gain of the amplifier SDiff also needs to be either 1 or −1, likewise under the control of the signals S0 to S3. FIG. 10 is a table summarizing the properties of the amplifier SDiff as a function of the control inputs S0 to S3.

Figure 7:
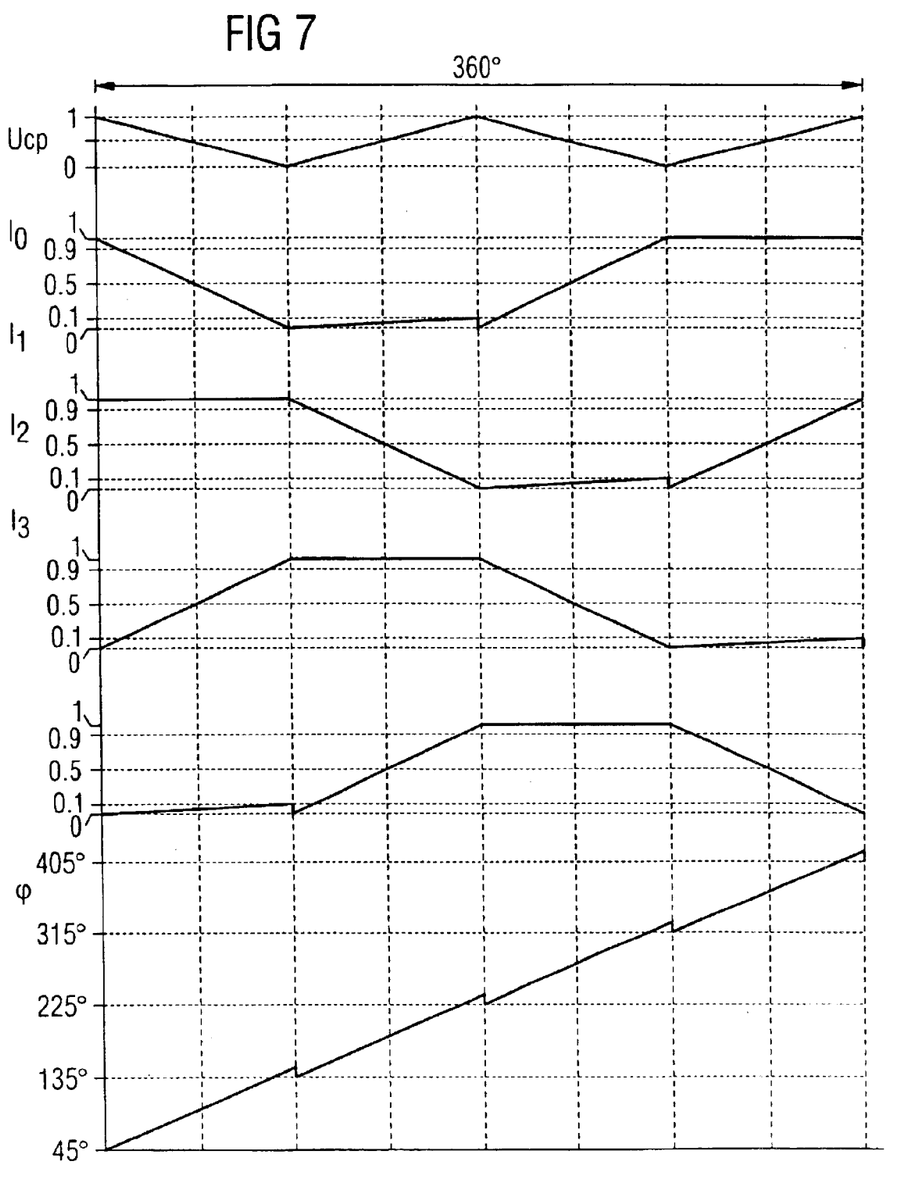
FIG. 7 shows control current and phase waveforms for a circuit in accordance with a further refinement of the invention.
Figure 8:
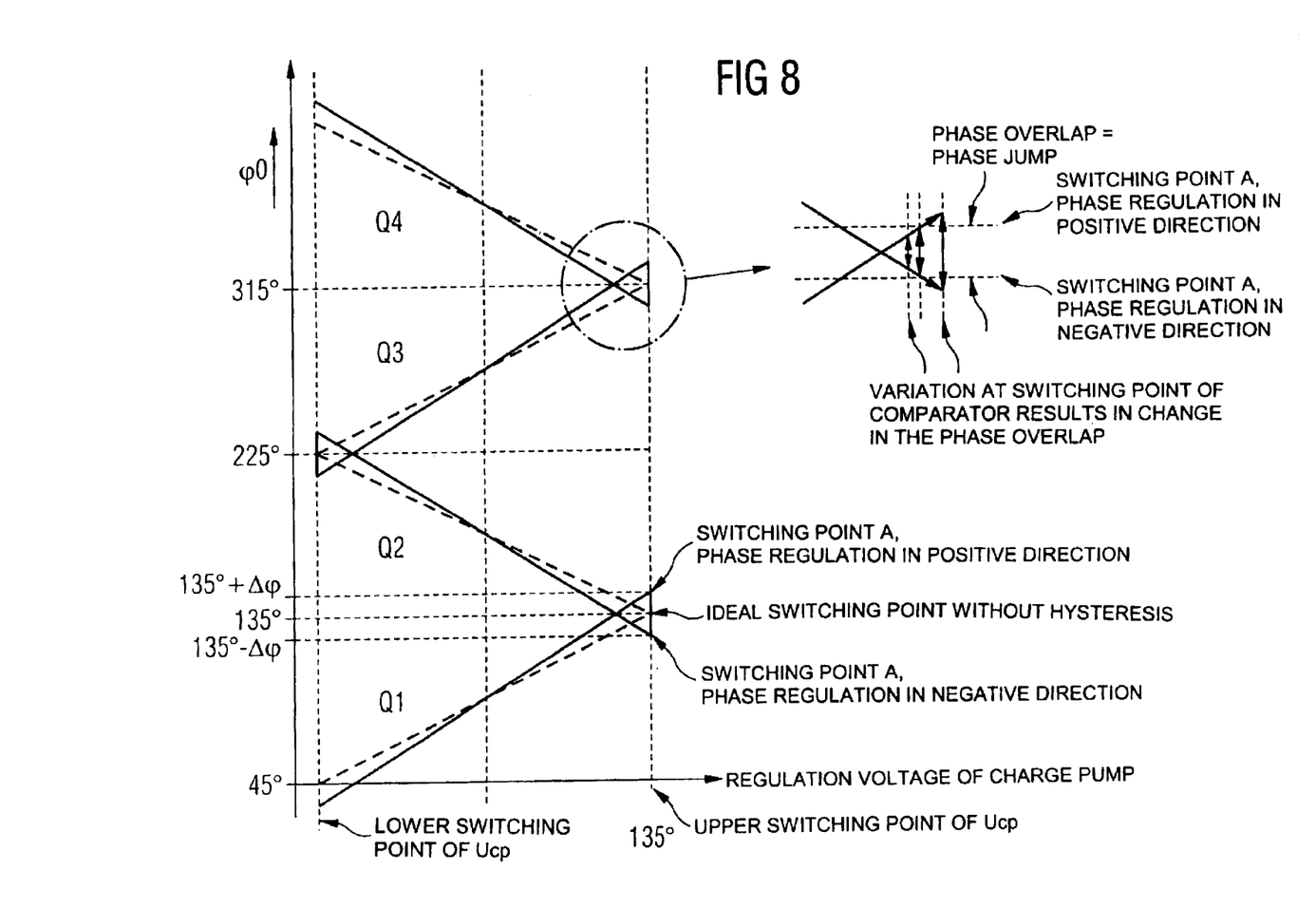
FIG. 8 shows the changeover of the polarity of a charge pump with hysteresis.

Another refinement of the invention provides a circuit, which avoids the aforementioned problem of the "phase holes" as a result of appropriate overlapping of the resulting phase positions. For this purpose, a return in phase takes place at the changeover points of the polarity of the charge pump 4 (FIG. 2), as shown in FIGS. 7 and 8. This admittedly results in a phase jump during the synchronization phase. In the steady state, however, no further return can take place if there is appropriate hysteresis. (Only in the case of relatively large phase modulation in a frequency range, which is narrower than the bandwidth of the DLL circuit 1 could a phase jump nevertheless occur. This is improbable in the real application, however. In addition, the phase jump can be kept so small that no bit errors arise).

Figure 9:
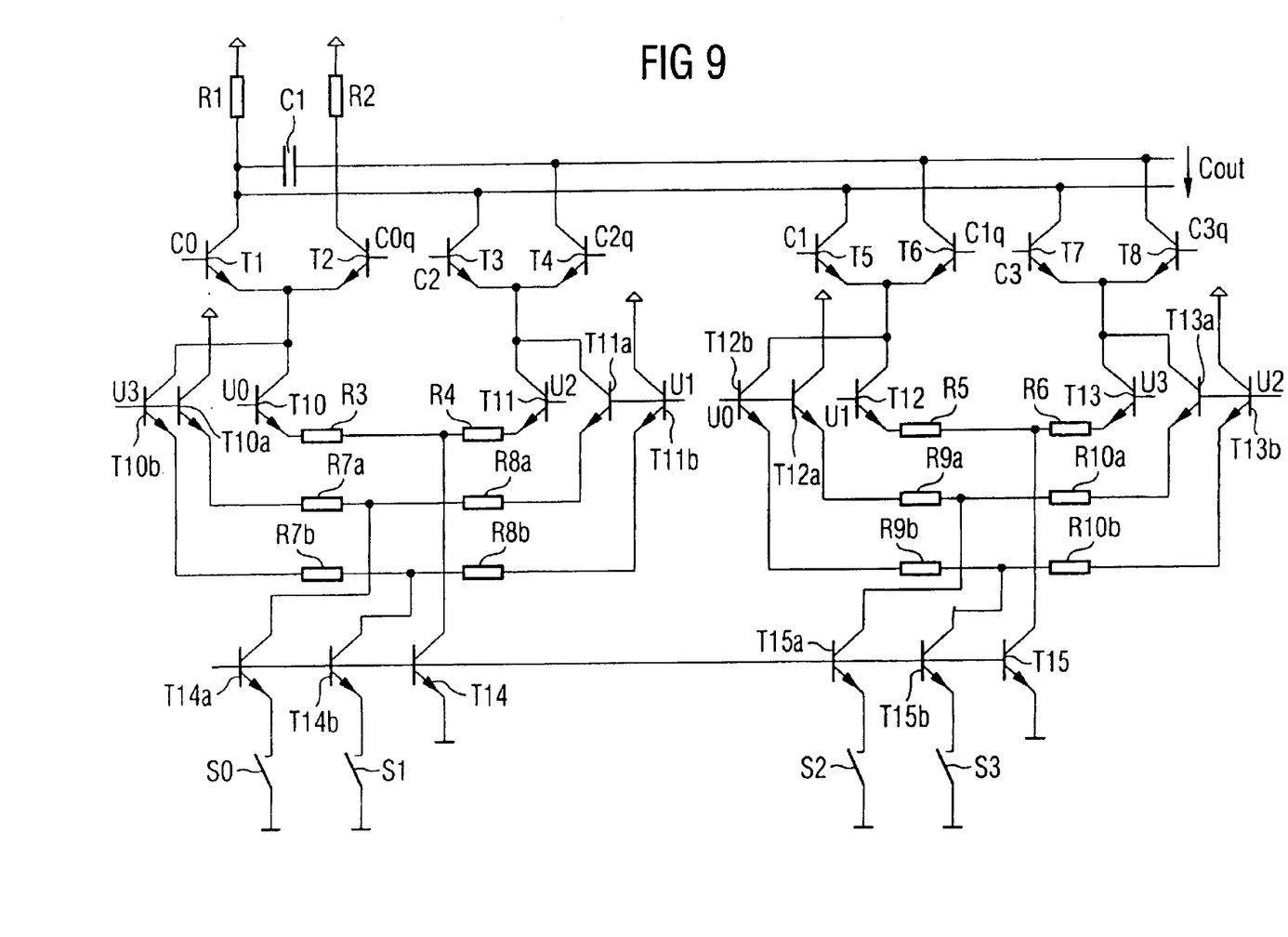
FIG. 9 shows a circuit employing the waveforms shown in FIGS. 7 and 8.

FIG. 9 shows one implementation of the circuit of this refinement. Connected in parallel with the differential stages T10 to T13 are further differential stages T11a to T13a and T10b to T13b, which increase the size of the phase amplification $\Delta\phi/dUx$ (Ux is the respective differential control voltage U0–U2, or U1–U3). The increase in the size of the phase amplification depends on the dimensioning of T14x, T15x or the currents thereof, and also on R7x to R10x. Since the currents in the mixer are connected and disconnected by S0 to S3 (using the switches S0 to S7 in FIG. 9, under the control of the signals of the same name from FIG. 4), the phase profile shown at the bottom of FIG. 7 with the described overlaps (or phase jumps) at 45°, 135°, 225° and 315° is produced. Mathematically, this can be described for the quadrants $45° < \phi < 135°$ as follows:

$$C_{out} = C0 * I_{T10}(U0) + C2 * I_{T11}(U2) + C1 * I_{T12}(\max) + C3 * I_{T13a}(U2),$$

where $$I_{T10} = 1 \ldots 0, I_{T11} = 0 \ldots 1, I_{T13a} = 0.1 * I_{T13}.$$

If it is assumed that $Cx = \sin(\omega t + 90° * x)$, $x = 0, 1, 2, 3$, a resulting phase is produced which corresponds to the mean value of the three phases plus the small component of the fourth phase, i.e. the respective component of the currents controls the phase angle. The clock signal C1 is supplied permanently (using factor 1). The clock signal C0 is reduced to the same extent as the clock signal C2 is input at increased level. In addition, a small component of C3 is input so that a phase of more than 90° (e.g. 100°) can be covered in a quadrant. By adding this small component of the respective fourth current (in this case $I_{T13a}$), the phase amplification is increased and the overlap is attained. This component determines the phase overlap.

The current values used in the formula are normalized, i.e. $I_{T11max} = 1$, $I_{T11min} = 0$, for example.

The invention is not limited to the exemplary embodiments described, but instead comprises modifications within the context of the scope of protection defined by the claims.

I claim:

1. A control loop, comprising:

a phase shifter for producing an output with a first clock phase;

a phase detector for detecting a phase difference between a second clock phase of a data signal and the first clock phase, said phase detector producing an output signal based on the detected phase difference;

a charge pump for integrating the output signal of said phase detector, said charge pump producing a control voltage for said phase shifter; and said phase shifter changing over a phase regulation direction when the control voltage reaches an upper or a lower range limit thereof;

said changing over of said phase regulation direction being performed with a hysteresis behavior.

2. The control loop according to claim 1, in combination with a delay locked loop circuit, said delay locked loop circuit having a delay locked loop control loop including said phase shifter, said phase detector, and said charge pump.

3. A method for producing a clock signal, which comprises:

detecting a phase difference between a clock phase of a first input signal and a clock phase of a first output signal of a phase shifter;

producing a second output signal based on the detected phase difference;

producing a control voltage for the phase shifter by integrating the second output signal; and changing a phase regulation direction of the phase shifter when the control voltage reaches an upper or a lower range limit thereof, the changing over of the phase regulation direction being performed with a hysteresis behavior.

4. A phase shifter for producing an output signal, which comprises:

a circuit for receiving an input signal having a phase and for receiving a control voltage within a voltage range;

said circuit being configured for producing an output signal having a phase, the phase of the output signal being controlled by the control voltage;

said circuit designed being configured for changing a phase regulation direction of the phase shifter when the control voltage reaches an upper or a lower range limit thereof;

wherein the changing over of the phase regulation direction is performed with a hysteresis behavior.

* * * * *